United States Patent
Gardner et al.

(10) Patent No.: US 6,188,110 B1
(45) Date of Patent: Feb. 13, 2001

(54) INTEGRATION OF ISOLATION WITH EPITAXIAL GROWTH REGIONS FOR ENHANCED DEVICE FORMATION

(75) Inventors: Mark I. Gardner, Cedar Creek; H. Jim Fulford, Jr., Austin, both of TX (US)

(73) Assignee: Advanced Micro Devices, Sunnyvale, CA (US)

(*) Notice: Under 35 U.S.C. 154(b), the term of this patent shall be extended for 0 days.

(21) Appl. No.: 09/173,015

(22) Filed: Oct. 15, 1998

(51) Int. Cl.[7] .................................................. H01L 29/796
(52) U.S. Cl. .................... 257/368; 257/361; 257/362; 257/497; 257/498; 257/499; 257/336; 257/337; 257/338; 257/444; 257/408; 257/368; 257/900; 257/374; 257/396; 257/397; 257/398
(58) Field of Search .................................. 257/361, 362, 257/497–499, 336–338, 344, 408, 900, 368, 374, 396–398

(56) References Cited

U.S. PATENT DOCUMENTS

| | | | |
|---|---|---|---|
| 5,357,133 | * 10/1994 | Morita | 257/374 |
| 5,436,476 | * 7/1995 | Hynecek | 257/224 |
| 5,606,191 | * 2/1997 | Wang | 257/336 |

* cited by examiner

*Primary Examiner*—Fetsum Abraham
(74) *Attorney, Agent, or Firm*—Bruce Barlick; James Harrison

(57) ABSTRACT

A method of forming integrated isolation regions and active regions includes first forming a plurality of dielectric layers upon a semiconductor substrate. Then, a patterned mask is applied to define portions of the dielectric layers that will remain to form isolation regions and to define portions of the dielectric layers that will be removed in an etch step to create voids to the surface of the semiconductor substrate. Subsequently, epitaxially growth is employed to form active regions within the voids that were previously formed. Transistors are then formed in and on the active regions and are subsequently interconnected to form an integrated circuit.

15 Claims, 5 Drawing Sheets

INTEGRATION OF ISOLATION WITH EPITAXIAL GROWTH REGIONS FOR ENHANCED DEVICE FORMATION

BACKGROUND

1. Field of the Invention

The present invention relates generally to integrated circuit manufacture; and more particularly to a method of manufacture and a structure in which isolation regions and epitaxial growth regions are integrated to produce active devices having enhanced performance.

2. Description of the Related Art

The structure and the various components, or features, of a metal oxide semiconductor (MOS) devices are generally well known. A MOS transistor typically includes a substrate material onto which a gate insulator and a patterned gate conductor are formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, of which, a portion of the substrate known as a "well" exists. The well is doped opposite the substrate so that it can accommodate junctions of an impurity type opposite the junction in the non-well areas. Accordingly, wells are often employed when both n-type and p-type transistors (i.e., Complementary MOS, "CMOS") are needed.

A pervasive trend in modern integrated circuit manufacture is to produce transistors having feature sizes as small as possible. To achieve a high density integrated circuit, features such as the gate conductors, source/drain junctions, and interconnects to the junctions must be made as small as possible. Many modern day processes employ features which have less than 0.15 microns critical dimensions. As feature size decreases, the size of the resulting transistors as well as the interconnects between transistors also decrease. Smaller transistor size allows more transistors to be placed on a single monolithic substrate, thereby allowing relatively large circuit systems to be incorporated on a single and relatively small die area. Further, smaller transistors typically have lower turn-on threshold voltages, faster switching speeds and consume less power in their operation. These features in combination allow for higher speed integrated circuits to be constructed that have greater processing capabilities and that produce lesser heat.

The benefits of high density circuits can only be realized if advanced processing techniques are used. For example, semiconductor process engineers and researchers often study the benefits of electron beam lithography and x-ray lithography to achieve the higher resolutions needed for submicron features. To some extent, wet etch has given way to a more advanced anisotropic (dry etch) technique. Further, silicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with small features or features arranged extremely close to one another. For example, as the channel length decreases, short channel effects ("SCE") generally occur. SCE cause threshold voltage skews at the channel edges as well as excessive sub-threshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor.

As feature sizes decrease, other components formed on the substrate must be formed to have a minimal effect on the smaller active devices. For example, isolation regions formed during oxide growth steps according to the well-known LOCOS process can extend into active regions of transistors, such extensions commonly referred to as a "bird's beak." The bird's beak extends into the active regions by a distance that is in proportion to the field dielectric thickness. This non-uniform junction between the active regions and the isolation regions causes the active regions to be non-uniform, thus affecting their operational characteristics.

Another problem that often occurs during the formation of isolation regions is that added impurities in the substrate tend to migrate into the oxide region as it is formed thereby creating undesired electron/hole flow characteristics. For example, boron is known to rapidly migrate not only along the substrate surface, but also perpendicular to the surface as well. In the latter instance, perpendicular migration of impurities into the growing field oxide causes a phenomenon known as oxidation enhanced diffusion (OED). To minimize OED, light ion channel-stop species such as boron must be implanted sufficiently deep so that they are not absorbed by the growing field oxide. However, deep or heavy doping causes high source/drain-to-substrate pn junction breakdown voltages.

Yet another problem that occurs during the formation of isolation regions is the creation of Kooi ribbons. Kooi ribbons are areas within the semiconductor that are formed of $NH_3$ and silicon (Si), the $NH_3$ created. The $NH_3$, after being created from a reaction of $H_2O$ and the masking silicon nitride $Si_3N_4$ during the oxidation step, diffuses through the oxide and reacts with the silicon substrate to form the silicon nitride ($Si_3N_4$) Kooi ribbons. These Kooi ribbons typically form in the proximity of the active regions during the field oxidation process.

Generally, the problems that occur in growing field oxides occur as a result of undesirable growth of the oxide in unwanted directions or locations and by introduced impurities. For example, OED is a result of out-diffusion from channel-stop implant to overlying, growing field oxide. Kooi ribbons are a result of $NH_3$ diffusion from nitride-covered active regions through the pad oxide and into the active region during field oxide growth. Any gate oxide formed in the active area upon the ribbon locations are thinner and of lower quality than in other areas, causing low voltage breakdown of the gate oxide. Typically, a sacrificial gate oxide must be formed and thereafter stripped to remove the Kooi ribbon. Thus, this problem creates the need for additional processing steps and resources.

Thus, there exists a need in the art for better methods of forming isolation region/active regions.

SUMMARY OF THE INVENTION

The problems outlined above are in large part solved by the transistor formation process according to the present invention in which isolation regions and active regions are formed that each possess uniform and consistent geometric and material properties. The isolation process hereof is carried out without having to locally form dielectrics in the field regions, i.e., without locally growing oxides using the LOCOS process. Instead of locally oxidizing silicon in the field regions, the present process blanket forms a dielectric blanket layer across the entire wafer surface. The blanket-formed dielectric layer may include both a first dielectric layer and a second dielectric layer. The first dielectric layer is relatively thin and is much thinner than conventional field oxides. A second dielectric layer is then formed across the entire first dielectric layer and is thicker, as compared to the first dielectric layer.

The blanket-formed first and second dielectric layers are then pattern masked to expose areas in which active regions will be formed. The first and second dielectric layers are then selectively removed to form voids in which the active regions are to be formed. Then, an epitaxial growth method is used to grow source/drain regions in the voids. After the source and drain regions are grown, the integrated circuit continues to form remaining portions of transistors and other circuit components and connecting the same to form an integrated circuit.

By applying the first and second dielectric layers and then etching the films to form the areas in which active regions will be grown, a clean, vertical boundary is established between the isolation regions and the active regions, thus avoiding creation of bird's beaks as would be formed in a LOCOS process. Thus, the isolation regions do not extend into the subsequently formed active regions. Resultantly, uniform and consistent operation of circuit elements formed in the epitaxially grown active regions may be obtained. Further, because of the relatively fast growth rate of the epitaxially grown active regions, the depth of the isolation regions may be easily increased to achieve enhanced isolation between neighboring devices.

By creating the areas in which the active regions will be epitaxially grown in an environment free of $H_2O$, the formation of Kooi ribbons may be avoided. Further, by forming the first dielectric layer upon the surface of the substrate boron up diffusion into the first and second dielectric layers may be prevented. Moreover, by epitaxially growing the active regions in a desired environment, the active regions may be grown without defects in a geometrically desired fashion with desired properties.

These and other aspects of the present invention will become apparent with further reference to the drawings and specification which follow.

BRIEF DESCRIPTION OF THE DRAWINGS

A better understanding of the present invention can be obtained when the following detailed description of the described embodiments is considered in conjunction with the following drawings, in which.

DETAILED DESCRIPTION OF THE DRAWINGS

Figure 1A:
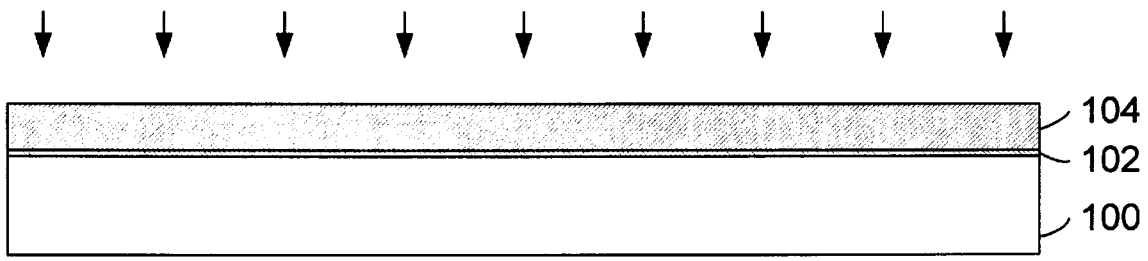
FIGS. 1A through 1C are partial cross-sectional views of a semiconductor substrate illustrating the formation of transistors according to the present invention.
Figure 1B:
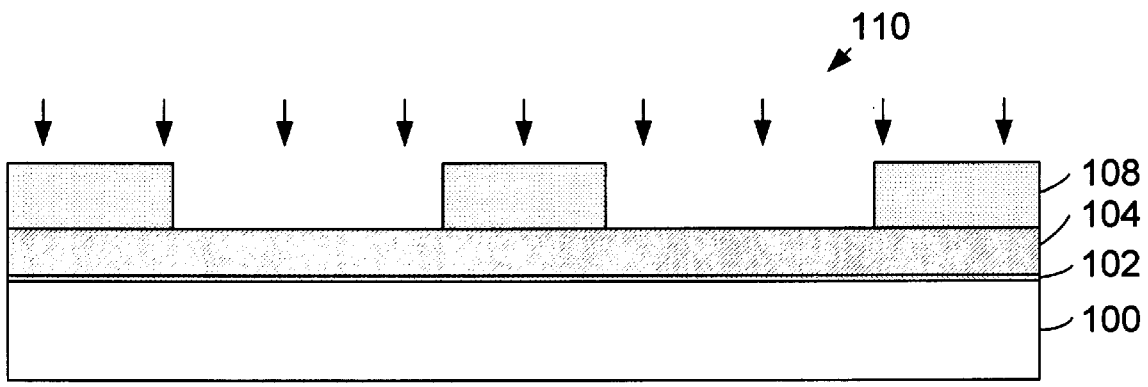
Figure 1C:
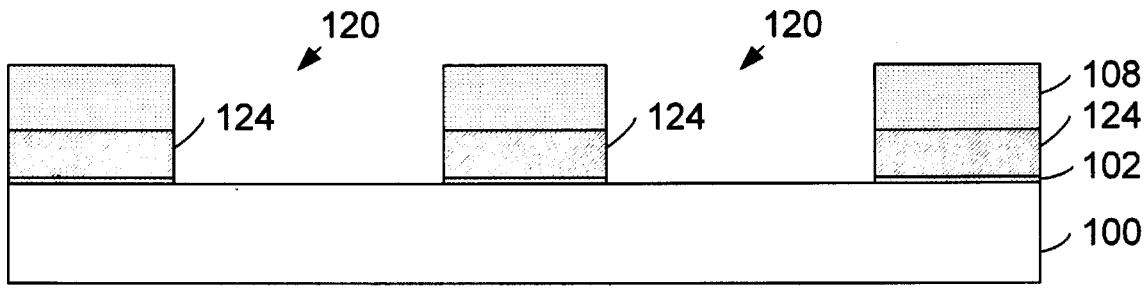

FIGS. 1A through 1C are partial cross-sectional views of a semiconductor substrate illustrating the formation of transistors according to the present invention. Referring now to FIG. 1A, a silicon substrate 100 is shown with an $N_2O$ layer formed thereon as a first dielectric layer 102. The first dielectric layer 102 according to one embodiment of the invention, comprises a thermally grown oxide that is grown in the absence of $H_2O$ to a thickness of approximately 50 to 100 Angstroms. The first dielectric layer 102 serves to form an adequate dielectric that is notably thinner than conventionally grown field oxides and serves to prevent boron (or another dopant) up diffusion from the silicon substrate 100.

Continuing to refer to FIG. 1A, a second dielectric layer 104 is formed upon the first dielectric layer 102. The second dielectric layer 104 is deposited and formed to a thickness of approximately 0.3 micrometers to 2.0 micrometers. After their formation, the first dielectric layer 102 and the second dielectric layer 104 may be densified in an annealing process to enhance the densities of the films.

Referring now to FIG. 1B, a patterned mask (photo resist) 108 is applied upon the second dielectric layer 104. The patterned mask 108 protects isolation regions from etching according to specified design requirements but does not protect areas in which active regions will subsequently be formed. An etch step is then performed (etch referred to as numeral 110) to remove portions of the first dielectric layer 102 and the second dielectric layer 104 unprotected by the patterned mask 108 to form isolation regions 124.

FIG. 1C illustrates the substrate after completion of the etch step. As shown, voids 120 are formed that are surrounded by the isolation regions 124 which extend to the substrate 100. After the etch step is completed, remaining portions of the patterned mask 108 are removed.

Figure 2A:
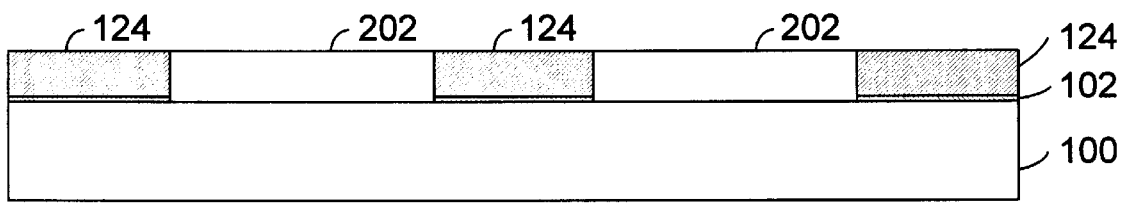
FIGS. 2A through 2C are partial cross sectional views of the semiconductor substrate of FIGS. 1A through 1C illustrating the formation of transistors according to present invention during subsequent formation steps.
Figure 2B:
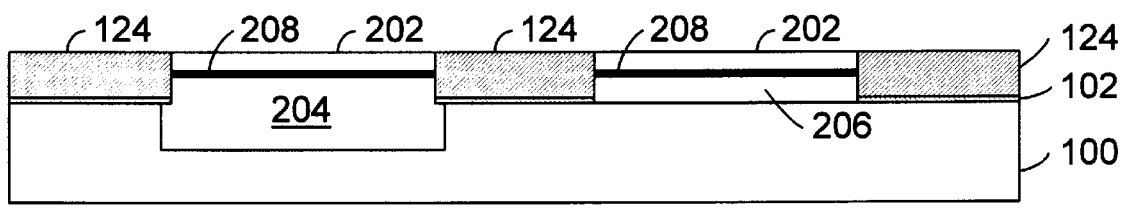
Figure 2C:
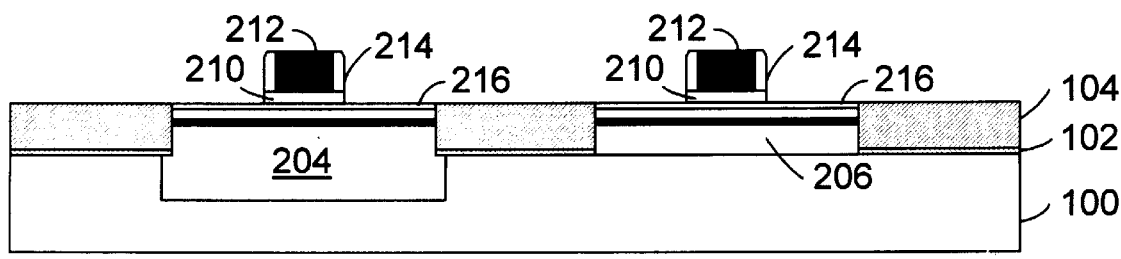

FIGS. 2A through 2C are partial cross sectional views of the semiconductor substrate of FIGS. 1A through 1C illustrating the formation of transistors according to present invention during subsequent formation steps. Referring now to FIG. 2A, it may be seen that the substrate 100 includes epitaxially grown silicon 202 formed within the voids 120 (as were shown in FIG. 1C) to create active regions 202.

FIG. 2B illustrates the substrate after the formation of wells and punch through regions. In one type of well formation, a well 204 is formed to include the epitaxially grown active region 202 as well as a portion of the substrate 100. In another type of well formation, all or a portion of the epitaxially grown active region 202 is doped to form the well 206. Additionally, punch through regions 208 may be formed within the epitaxially grown active regions 202.

Referring now to FIG. 2C, threshold voltage ($V_t$) implants 216 are formed in the active regions 202. A gate oxide layer 210 is formed and a gate conductor layer 212 is formed on top of the gate oxide layer 210, both of which are pattern masked and etched to form the self-aligned gate oxide 210/gate conductor 212 stacks. Additionally, spacers 214 are formed adjacent to each gate conductor 212. As will be discussed with reference to FIG. 5, source/drain regions and lightly doped drain (LDD) regions are subsequently formed. Construction of these features is generally known in the art and will be discussed herein only to expand upon the teachings of the present invention.

Figure 3:
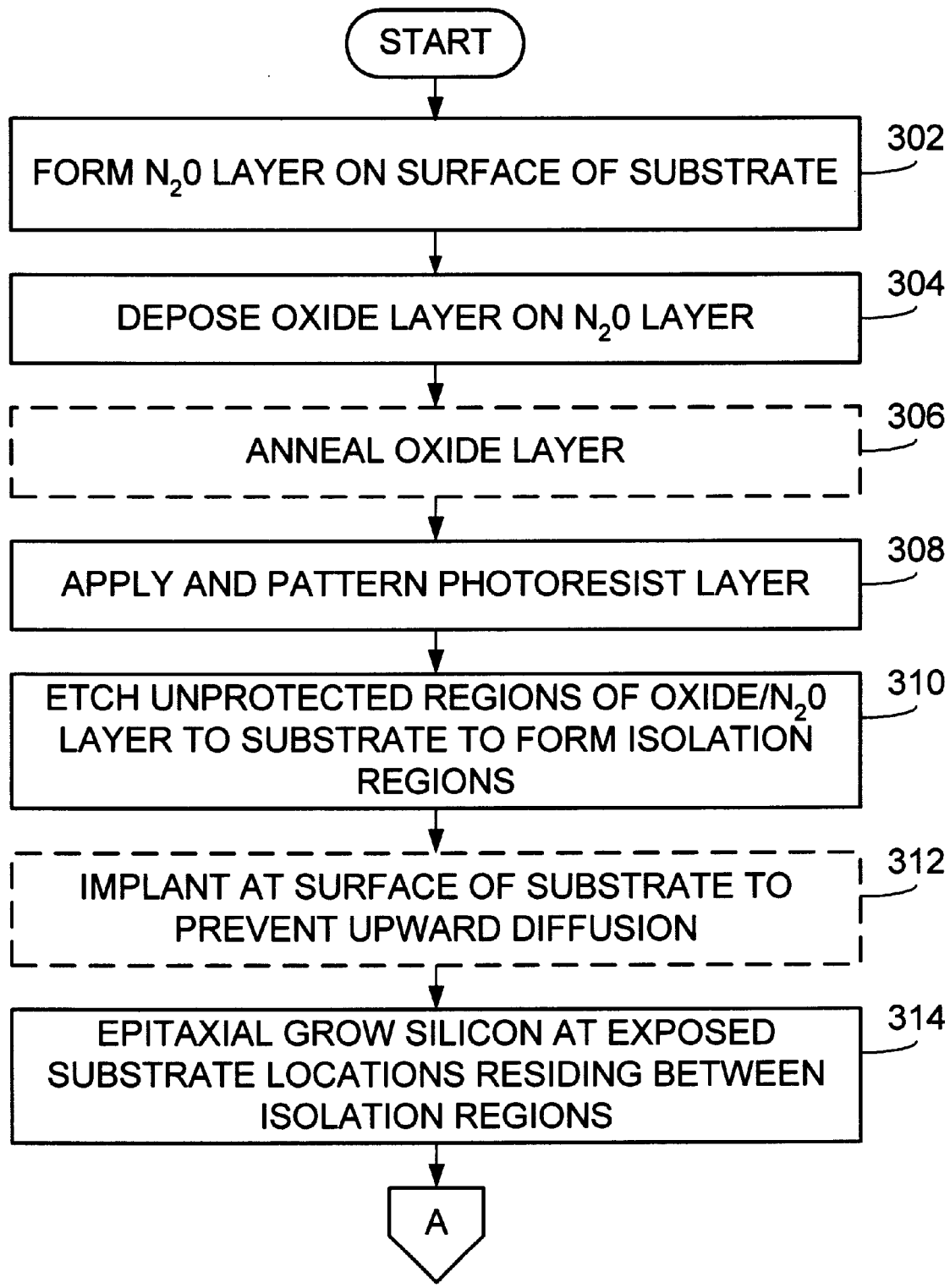
FIG. 3 is a flow chart illustrating a first series of steps of a method for forming a transistor upon a semiconductor substrate according to the present invention.

FIG. 3 is a flow chart illustrating a first series of steps of a method for forming a transistor upon a semiconductor substrate according to the present invention. Referring now to FIG. 3, the method generally includes forming first and second dielectric layers 102 and 104, respectively, as shown in FIG. 1A and thereafter etching select regions of those films in a method referenced herein as a blanket-grow-and-etch technique. Active regions and devices formed therein are isolated by a field dielectric comprising a combination of the first and second dielectric layers.

More specifically, a silicon substrate has a $N_2O$ layer formed thereon (step 302) as a first dielectric layer 102. The first dielectric layer 102, according to one embodiment, comprises a thermally grown oxide that is grown in the absence of $H_2O$. Thermal oxidation is usually accomplished by placing wafers in a slotted quartz carrier which is then inserted into a quartz furnace tube (the step referred to as the "tube" process). The tube is surrounded by a resistance heater and is capable of controlling flow of inert gases such as nitrogen and the oxidant. A vented cap is placed over the input end of the tube. The gas flows in the back end of the tube, over the wafers, and is exhausted through the vented cap. Modern furnaces are computer controlled and programmable. Wafers are usually loaded, in an inert environment, ramped to temperature, and switched to the oxidant for a specified time. In this tube process, the wafer is typically allowed to stay in the tube for approximately 2 minutes to 10 minutes at a temperature of 800 degrees to 1050 degrees Celsius. The first dielectric layer 102 will have a thickness of approximately 50 to 100 Angstroms. The first dielectric layer 102, when formed in this manner, will prevent boron up diffusion during subsequent epitaxial growth.

In an alternate embodiment of the invention, the first dielectric layer 102 is formed in a rapid thermal annealing step (RTA) at 800 degrees to 1050 degrees Celsius for a period of 10 to 60 seconds. While the above description of step 302 is in terms of $N_2O$, other elements or combinations of elements including argon, $N_2$ or NO may be used.

A goal in formation of the first dielectric layer 102 is to use a material which results in enhanced dielectric properties from that of thicker, conventional field oxides. To accomplish this goal, the first dielectric layer 102 is formed in the absence of a hydrogen or $H_2O$ ambient. Absent hydrogen, the first dielectric avoids the formation of $NH_3$ at the active region boundary, i.e., avoids Kooi ribbon and problems associated with Kooi ribbon. When deposited, the first dielectric layer 102 is deposited from a silicon and oxide source, and may thereafter be annealed in a gas ambient selected from the group consisting of Ar, $N_2$, $NO_2$ and NO.

After the first dielectric layer 102 is formed on the silicon substrate 100, the second dielectric layer 104 is formed upon the first dielectric layer 102 (step 304). The second dielectric layer 104 is deposited in an oxide deposition step in one embodiment. The thickness of the second dielectric layer 104 is proportional to the desired future trench height, and has a thickness of approximately 0.3 to 2.0 microns.

According to the described embodiment, a low pressure chemical vapor deposition (LPCVD) process at 600 to 800 degrees Celsius is used in this oxide deposition step. Alternatively, the oxide deposition layer 104 may be formed in a plasma deposition step at 50 to 350 degrees Celsius or by a tetra-ethyl-ortho-silicate (TEOS) step at 50 to 350 degrees celsius.

The first 102 and/or second dielectric layers 104 may also comprise any dielectric having insulative capability including oxide, oxynitride, $N_2O$ oxide, $Ta_2O_5$, NO oxide, polysilicon, or silicon nitride. If silicon nitride is used as the dielectric, it is generally used to form the second dielectric layer 104, with the first dielectric layer 102 being a dielectric other than silicon nitride. The second dielectric 104 is preferably thicker than the first dielectric layer 102. As mentioned before, the thickness is determined by design requirements that typically consider desired isolation depth.

If both the first 102 and second dielectric layers 104 are deposited, an anneal step, such as a rapid thermal anneal step, is optionally performed after each deposition step and/or after both deposition steps to densify the deposited material (step 306). The annealing step is preferably performed in the temperature range between 900 degrees to 1050 degrees celsius for approximately 15 minutes.

After the optional annealing step is performed (step 306), or at least after the second dielectric layer has been added to the device (step 304), a patterned mask 108 of FIG. 1B, is formed to define an etch pattern (step 308). The patterned mask 108 is used to expose areas that are to become the active regions 202 (e.g., the source and drain regions for a field effect transistor) and to protect isolation regions 124. The patterned mask 108 may be formed of a photo resist, silicon dioxide, silicon nitride or another mask material that will withstand the subsequent etch step.

After the patterned mask 108 has been added to define the active regions and to only protect the isolation regions 124, unprotected areas are etched to form voids 120 as shown generally in FIG. 1C at numeral 120 (step 310). The etching is performed using an anisotropic etch in the described embodiment of the invention. An anisotropic etch performed as a plasma etch operates to produce a demarcation between isolation regions 124 and active regions 202 having essentially no encroachment problem such as that which is generally associated with local oxidation processes.

An optional step that is performed according to the described embodiment of the invention is to implant one of nitrogen or argon at the surface of the substrate 100 to create an ion implant layer (step 312). This ion implant step is performed with an implant energy of 10 keV to 30 keV and with a dose of $5 \times 10^{14}$ ions/cm$^2$ to $5 \times 10^{15}$ ions/cm$^2$. The Nitrogen or Argon implant layer prevents subsequent Boron up diffusion into the active regions that will subsequently be formed.

After the step 312 of forming an implant layer at the upper surface of the substrate 100 in the voids 120 to avoid upward diffusion, active regions 202 are epitaxially grown at the exposed substrate regions or locations residing between the isolation regions 124 (step 314). Epitaxial growth is a process of growing a portion of a semiconductor substrate by exposing the substrate to elements at an elevated temperature to prompt the substrate to react with the elements in a manner that causes silicon to grow upon the substrate. In the inventive method herein, the silicon is epitaxially grown in the voids 120 residing between the isolation regions 124 to form the epitaxially grown silicon substrate 202 as shown in FIG. 2. Because a semiconductor substrate requires impurities to render it non-insulative, impurities may be introduced into the silicon tetrachloride-hydrogen gas stream to cause the epitaxially grown active regions to have a particular conductivity.

In the described embodiment, the epitaxial growth step is performed by exposing the silicon substrate to $SiH_2Cl_2$ gas and $BF_2$ (dopant) gas at 800 to 1075 degrees C. to form a p-type epitaxial layer. In a batch process, the substrate is exposed to the gas for 10 minutes to 60 minutes. In a process for a single wafer, the wafer is exposed to the gas for 2 minutes to 15 minutes. For N-type epitaxial layer, according to the described embodiment of the invention, $SiH_4$ gas and Arsenic (dopant) gas are used to form n-type epitaxial layer.

Figure 4:
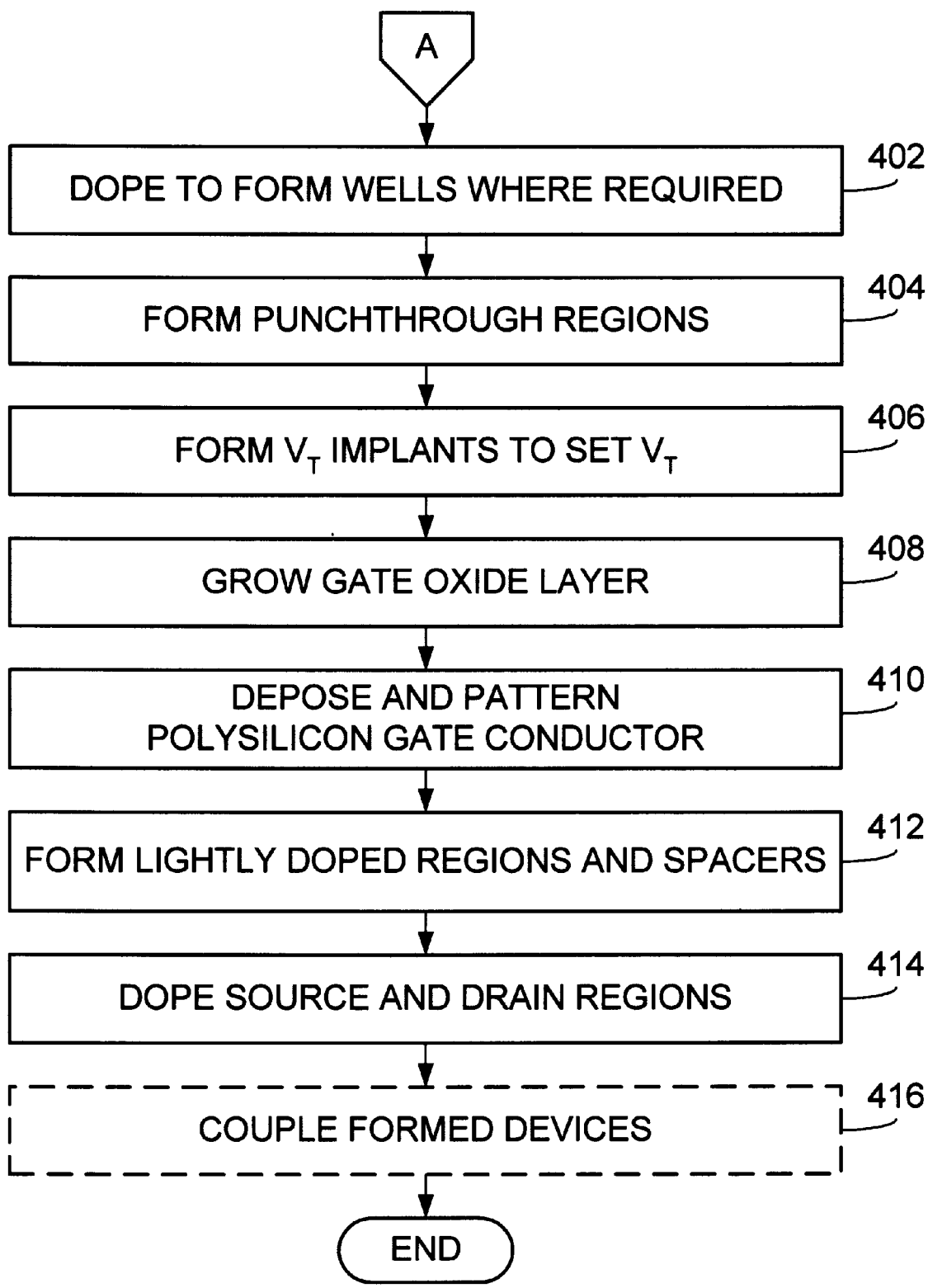
FIG. 4 is a flow chart illustrating a second series of steps of a method for forming a transistor upon a semiconductor substrate according to the present invention.

FIG. 4 is a flow chart illustrating a second series of steps of a method for forming a transistor upon a semiconductor substrate according to the present invention. As may be seen, the steps illustrated in FIG. 4 are a continuation of the method described in FIG. 3. Referring now to FIG. 4, the substrate is selectively doped to form wells where required (step 402). In performing such selective doping, masking is typically required to protect non-doped regions. The wells may be formed in differing manners. For example well 204 may be formed to include the epitaxial growth region 202 and as well as a portion of the substrate 100 that resides below the epitaxial growth region 202. In another case, the well 206 is formed to partially or fully consume the epitaxial growth region 202.

The formation of wells is generally known to include the implantation of ions to alter the type of substrate. For example, if the substrate 100 is p-type and the epitaxial growth region 202 is grown p-type, the formation of wells 204 and/or 206 would include doping the wells 204 and/or 206 n-type. Alternately, if the substrate is n-type and the epitaxial growth region 202 is grown n-type, the formation of wells 204 and/or 206 would include doping the wells 204 and/or 206 p-type. If the epitaxial growth region 202 is grown without doping, then a lesser level of lesser well dopant would be required to produce the desired well dopant type.

Subsequently, a punchthrough region 208 may formed in a horizontal (non-perpendicular) manner extending across and below the source and drain regions (step 404). The placement of the punchthrough implant 208 is based upon design goals. Formation of punchthrough regions 208 is also generally known. Next, Vt implants may be formed to set the voltage turn-on level for the transistor (step 406). These, implants, typically made of boron, are lightly implanted at the substrate surface so as to increase the threshold turn on voltage to a specified level.

Subsequently, standard device formation techniques are employed to form remaining portions of the transistors in and upon the epitaxial growth regions grown regions 202. More specifically, a gate oxide layer is grown (step 408). Thereafter, a polysilicon gate conductor layer is deposited upon the gate oxide layer, the surface of the device is patterned to form the gate conductor/gate oxide stack and the surface is etched to form the gate conductor/gate oxide stacks (step 410).

Then, the LDD regions and spacers are formed (step 412)and the source and drain regions are doped (step 414) to finish forming the semiconductor devices. Finally, the formed devices are coupled to complete the fabrication of the integrated circuit (step 416).

Figure 5:
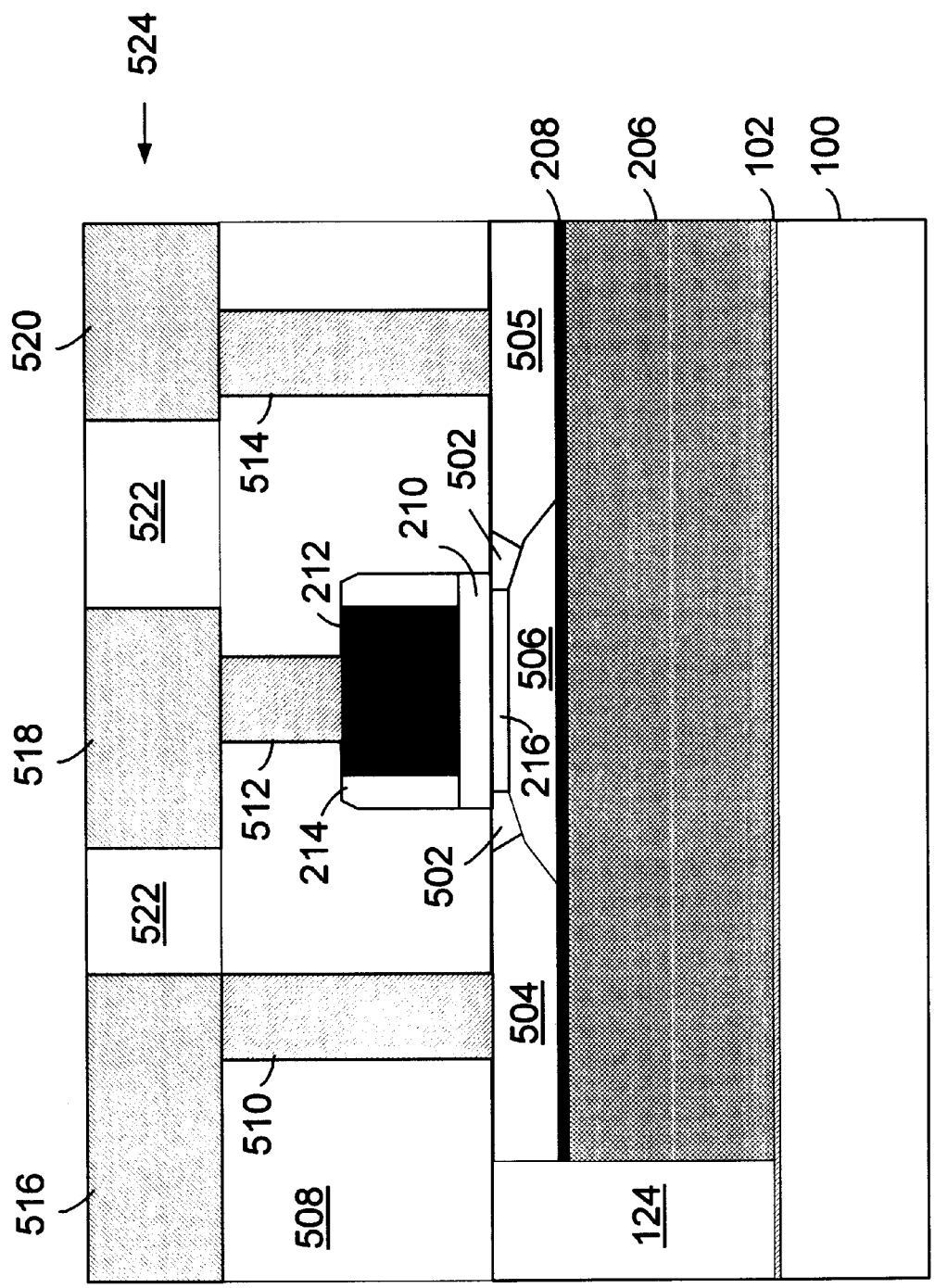
FIG. 5 is a partial cross sectional diagram of a transistor that has been formed according to the present invention that illustrates in detail the components of the transistor and how the transistor can be connected to other transistors to form an integrated circuit.

FIG. 5 is a partial cross sectional diagram of a transistor which has been formed according to the present invention and that illustrates in detail the components of the transistor and how the transistor can be connected to other transistors to form an integrated circuit. Referring now to FIG. 5, each of the components as discussed previously include the part numbers used to introduce the components. In addition to those components, FIG. 5 illustrates the LDD regions 502 formed as described in step 412 of FIG. 4 as well as the source 504 and the drain 505 of the transistor after being doped as discussed in relation to step 414 of FIG. 4. FIG. 5 also illustrates the channel region 506 formed between source 504 and drain 505. Punchthrough region 208 and well 206 are shown to be formed in the epitaxial growth region 202. Vt regions 216 is shown to reside under the gate insulator 210. Isolation region 124 resides adjacent the epitaxial growth region 202.

An insulation layer 508 is formed in a CVD process upon the transistor and other portions of the substrate at a thickness that is required to isolate a first metallization layer 524 of the device of FIG. 5 from transistors and other devices of the integrated circuit. Typically, the insulation layer 508 is polished in a CMP process to form a planar upper surface. It is then masked and etched to form openings to the active regions of the transistors (e.g., source 504, drain 505 and gate conductor).

Once the openings are formed, a sputtering, deposition or evaporation process, by way of example, is used to fill the vias with a metal. The resulting metallized vias 510, 512 and 514 are formed. Metals that can be used in this process include Ti, TiN, W and Al. The vias 510, 512 and 514 may be deposited in a same step that forms metallization layer 524. The metallization layer 524 is then masked to form a conductor pattern and is etched back to the insulation layer 508 to form the conductors 516, 518 and 520. An insulator layer 522 may be formed to isolate conductive paths 516, 518 and 520 formed in the metallization layer 524, particularly if a subsequent metallization layer is formed upon the metallization layer 524. Subsequent metallization layers (not shown) can provide further interconnections among the devices and external to the formed integrated circuit.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. An integrated circuit formed on a substrate having integrated isolation regions and active regions, the integrated circuit comprising:

a plurality of isolation regions formed upon the substrate from a first dielectric layer residing upon the substrate and a second dielectric layer that resides upon the first dielectric layer;

epitaxially grown active regions that have been grown upon the substrate and that are defined by voids that were etched from the first dielectric layer and the second dielectric layer and that also define the plurality of isolation regions, the sidewalls of the epitaxially grown active regions oriented substantially perpendicular to the surface of the substrate;

an ion implant layer residing at the junction between the epitaxially grown active regions and the substrate, the ion implant layer preventing dopant diffusion from the substrate to the epitaxially grown active regions; and a plurality of transistors formed in and on the epitaxially grown active regions.

2. The integrated circuit of claim 1, each of the transistors comprising:
   a source region;
   a drain region;
   a gate insulator; and
   a gate conductor.

3. The integrated circuit of claim 1, each of the transistors further comprising a voltage threshold region.

4. The integrated circuit of claim 1, each of the transistors further comprising lightly doped drain regions.

5. The integrated of claim 1, each of the transistors further comprising a punchthrough region.

6. The integrated of claim 1, further comprising a plurality of interconnections between the plurality of transistors.

7. The integrated circuit of claim 1, wherein the ion implant layer includes nitrogen ions implanted into the substrate.

8. The integrated circuit of claim 1, wherein the ion implant layer includes argon ions implanted into the substrate.

9. The integrated circuit of claim 1, wherein the first dielectric layer comprises silicon nitride.

10. The integrated circuit of claim 1, wherein the second dielectric layer comprises silicon nitride.

11. The integrated circuit of claim 1, wherein the first and second dielectric layers are selected from the group consisting of silicon oxide, oxynitride, $N_2O$ oxide, $Ta_2O_5$, NO oxide, polysilicon and silicon nitride.

12. The integrated circuit of claim 1, wherein:
   the first dielectric layer is selected from the group consisting of silicon oxide, oxynitride, N2O oxide, Ta2O5, NO oxide and polysilicon; and
   the second dielectric layer comprises silicon nitride.

13. The integrated circuit of claim 1, wherein:
   the first dielectric layer comprises silicon nitride; and
   the second dielectric layer is selected from the group consisting of silicon oxide, oxynitride, N2O oxide, Ta2O5, NO oxide and polysilicon.

14. The integrated circuit of claim 1, wherein the first dielectric layer has a thickness of between 50 and 100 Angstroms.

15. The integrated circuit of claim 1, wherein the second dielectric layer has a thickness of between 0.3 micrometers and 2.0 micrometers.

* * * * *